(12) United States Patent
Lower et al.

(10) Patent No.: US 7,915,527 B1
(45) Date of Patent: *Mar. 29, 2011

(54) HERMETIC SEAL AND HERMETIC CONNECTOR REINFORCEMENT AND REPAIR WITH LOW TEMPERATURE GLASS COATINGS

(75) Inventors: Nathan P. Lower, North Liberty, IA (US); David M. Brower, Marion, IA (US); Ross K. Wilcoxon, Cedar Rapids, IA (US)

(73) Assignee: Rockwell Collins, Inc., Cedar Radids, IA (US)

( * ) Notice: Subject to any disclaimer, the term of this patent is extended or adjusted under 35 U.S.C. 154(b) by 648 days.

This patent is subject to a terminal disclaimer.

(21) Appl. No.: 11/784,158

(22) Filed: Apr. 5, 2007

Related U.S. Application Data

(63) Continuation-in-part of application No. 11/508,782, filed on Aug. 23, 2006.

(51) Int. Cl.
*H05K 5/06* (2006.01)
*H01L 23/10* (2006.01)

(52) U.S. Cl. ............... 174/50.63; 174/50.51; 174/50.54; 174/50.61; 257/634; 257/701; 257/710

(58) Field of Classification Search ............... 428/210; 174/50.63, 50.51, 50.54, 50.61; 257/634, 257/701, 710
See application file for complete search history.

(56) References Cited

U.S. PATENT DOCUMENTS

| | | | |
|---|---|---|---|
| 3,654,528 A | | 4/1972 | Barkan |
| 3,723,790 A | * | 3/1973 | Dumbaugh et al. ........... 313/316 |
| 3,812,404 A | | 5/1974 | Barkan et al. |
| 4,177,015 A | | 12/1979 | Davidson |
| 4,294,658 A | | 10/1981 | Humphreys et al. |
| 4,410,874 A | * | 10/1983 | Scapple et al. ................ 338/307 |
| 4,505,644 A | | 3/1985 | Meisner et al. |
| 4,513,029 A | | 4/1985 | Sakai |

(Continued)

FOREIGN PATENT DOCUMENTS

JP  60-013875  1/1985

(Continued)

OTHER PUBLICATIONS

U.S. Appl. No. 12/286,207, filed Sep. 29, 2008, Lower et al.

(Continued)

*Primary Examiner* — Cathy Lam
(74) *Attorney, Agent, or Firm* — Matthew J. Evans; Daniel M. Barbieri

(57) ABSTRACT

The present invention is directed to low-cost, low-processing temperature, and simple reinforcement, repair, and corrosion protection for hermetically sealed modules and hermetic connectors. A thin layer of glass is applied over the module's seal or the connector' glass frit. The layer of glass comprises an alkali silicate glass. The layer of glass is produced from a material which is a low viscosity liquid at room temperature prior to curing and is cured at low temperatures (typically no more than about 160 degrees Celsius). Subsequent to curing, the layer of glass is intimately bonded to the seal, watertight, and is stable from about negative two-hundred forty-three degrees Celsius to at least about seven-hundred twenty-seven degrees Celsius. The glass layer provides corrosion protection, seals any existing leaks, and possesses good flexibility and adhesion. The resulting bond is hermetic with good aqueous durability and strength similar to that of monolithic structures.

10 Claims, 5 Drawing Sheets

U.S. PATENT DOCUMENTS

| | | | | |
|---|---|---|---|---|
| 4,560,084 A * | 12/1985 | Wolfson | ............... | 156/379.7 |
| 4,572,924 A * | 2/1986 | Wakely et al. | ............ | 174/50.52 |
| 4,622,433 A * | 11/1986 | Frampton | ................. | 174/539 |
| 4,761,518 A * | 8/1988 | Butt et al. | ................. | 174/538 |
| 4,765,948 A | 8/1988 | Deluca et al. | | |
| 4,773,826 A | 9/1988 | Mole | | |
| 4,802,531 A | 2/1989 | Nathenson et al. | | |
| 4,882,212 A * | 11/1989 | SinghDeo et al. | ............. | 428/76 |
| 5,041,342 A * | 8/1991 | Umeda et al. | ............... | 428/632 |
| 5,136,365 A | 8/1992 | Pennisi et al. | | |
| 5,140,109 A * | 8/1992 | Matsumoto et al. | .......... | 174/539 |
| 5,184,211 A | 2/1993 | Fox | | |
| 5,195,231 A | 3/1993 | Fanning et al. | | |
| 5,232,970 A | 8/1993 | Sole et al. | | |
| 5,244,726 A | 9/1993 | Laney et al. | | |
| 5,265,136 A | 11/1993 | Yamazaki et al. | | |
| 5,315,155 A * | 5/1994 | O'Donnelly et al. | ......... | 257/711 |
| 5,502,889 A | 4/1996 | Casson et al. | | |
| 5,581,286 A | 12/1996 | Hayes et al. | | |
| 5,686,703 A | 11/1997 | Yamaguchi | | |
| 5,702,963 A | 12/1997 | Vu et al. | | |
| 5,863,605 A | 1/1999 | Bak-Boychuk et al. | | |
| 5,958,794 A | 9/1999 | Bruxvoort et al. | | |
| 5,965,947 A | 10/1999 | Nam et al. | | |
| 5,991,351 A | 11/1999 | Woolley | | |
| 6,010,956 A | 1/2000 | Takiguchi et al. | | |
| 6,019,165 A | 2/2000 | Batchelder | | |
| 6,021,844 A | 2/2000 | Batchelder | | |
| 6,039,896 A | 3/2000 | Miyamoto et al. | | |
| 6,048,656 A | 4/2000 | Akram et al. | | |
| 6,087,018 A | 7/2000 | Uchiyama | | |
| 6,110,656 A | 8/2000 | Eichorst et al. | | |
| 6,124,224 A * | 9/2000 | Sridharan et al. | ............... | 501/15 |
| 6,159,910 A | 12/2000 | Shimizu et al. | | |
| 6,451,283 B1 | 9/2002 | Kuznicki et al. | | |
| 6,452,090 B2 | 9/2002 | Takato et al. | | |
| 6,586,087 B2 * | 7/2003 | Young | ........................ | 428/323 |
| 6,658,861 B1 | 12/2003 | Ghoshal et al. | | |
| 6,665,186 B1 | 12/2003 | Calmidi et al. | | |
| 6,708,501 B1 | 3/2004 | Ghoshal et al. | | |
| 6,798,072 B2 | 9/2004 | Kajiwara et al. | | |
| 6,800,326 B1 | 10/2004 | Uchiyama | | |
| 6,918,984 B2 | 7/2005 | Murray et al. | | |
| 7,078,263 B2 | 7/2006 | Dean | | |
| 7,131,286 B2 | 11/2006 | Ghoshal et al. | | |
| 7,176,564 B2 | 2/2007 | Kim | | |
| 7,202,598 B2 | 4/2007 | Juestel et al. | | |
| 7,293,416 B2 | 11/2007 | Ghoshal | | |
| 7,296,417 B2 | 11/2007 | Ghoshal | | |
| 7,340,904 B2 | 3/2008 | Sauciuc et al. | | |
| 7,342,787 B1 | 3/2008 | Bhatia | | |
| 7,348,665 B2 | 3/2008 | Sauciuc et al. | | |
| 2001/0046933 A1 | 11/2001 | Parkhill et al. | | |
| 2002/0170173 A1 | 11/2002 | Mashino | | |
| 2002/0189495 A1 | 12/2002 | Hayashi et al. | | |
| 2002/0189894 A1 | 12/2002 | Davis et al. | | |
| 2003/0047735 A1 | 3/2003 | Kyoda et al. | | |
| 2003/0080341 A1 | 5/2003 | Sakano et al. | | |
| 2003/0218258 A1 | 11/2003 | Charles et al. | | |
| 2003/0228424 A1 | 12/2003 | Dove et al. | | |
| 2004/0194667 A1 | 10/2004 | Reuscher | | |
| 2005/0099775 A1 | 5/2005 | Pokharna et al. | | |
| 2006/0045755 A1 | 3/2006 | McDonald et al. | | |
| 2006/0158849 A1 | 7/2006 | Martin et al. | | |
| 2007/0108586 A1 | 5/2007 | Uematsu et al. | | |
| 2008/0050512 A1 | 2/2008 | Lower et al. | | |
| 2008/0299300 A1 | 12/2008 | Wilcoxon et al. | | |

FOREIGN PATENT DOCUMENTS

| | | |
|---|---|---|
| JP | 2003-332505 A | 11/2003 |
| WO | WO 2006/095677 A1 | 9/2006 |
| WO | PCT/US2008/074224 | 8/2008 |
| WO | PCT/US2008/075591 | 9/2008 |
| WO | PCT/US2009/031699 | 1/2009 |

OTHER PUBLICATIONS

U.S. Appl. No. 12/240,775, filed Sep. 29, 2008, Lower et al.
U.S. Appl. No. 12/116,126, filed May 6, 2008, Lower et al.
U.S. Appl. No. 11/959,225, filed Dec. 18, 2007, Lower et al.
U.S. Appl. No. 11/784,932, filed Apr. 10, 2007, Lower et al.
U.S. Appl. No. 11/732,981, filed Apr. 5, 2007, Wilcoxon et al.
U.S. Appl. No. 11/732,982, filed Apr. 5, 2007, Boone et al.
U.S. Appl. No. 11/508,782, filed Aug. 23, 2006, Lower et al.
Click, et al., "Schott Low Temperature Bonding for Precision Optics," can be found at website: http://optics.nasa.gov/tech_days/tech_days_2004/docs/18%20Aug%202004/23%20Schott%20Low%20Temperature%20Bonding.pdf, p. 20.
Lewis, J. A., et al., Materialstoday: Jul./Aug. 2004, Direct Writing in three dimension, ISSN: 1369 7021© Elsevier Ltd 2004, pp. 32-39.
Optomec® Systems M3D® Breakthrough Technology for Printable Electronics, pp. 1-2.
PQ Corporation, "Bonding and Coating Applications of PQ® Soluble Silicates," Bulletin 12-31, (2003) p. 7.
PQ Corporation, PQ® Soluble Silicates in Refractory and Chemical-Resistant Cements, Bulletin 24-1, (2003), p. 6.
Thresh, John C., "The Action of Natural Waters on Lead," The Analyst, vol. XLVII, No. 560, (Nov. 1922) pp. 459-468.
International Search Report and Written Opinion for International Application No. PCT/US2008/075591, mail date Apr. 8, 2009, 7 pages.
Non-Final Office Action for U.S. Appl. No. 11/784,932, dated Apr. 3, 2009, 8 pages.
Non-Final Office Action for U.S. Appl. No. 11/508,782, dated Jun. 16, 2009, 13 pages.
International Search Report and Written Opinion for Application No. PCT/US2009/036355, mail date Jun. 30, 2009, 11 pages.
International Search Report and Written Opinion for Application No. PCT/US2009/031699, mail date Aug. 18, 2009, 16 pages.
Office Action for U.S. Appl. No. 11/959,225, mail date Dec. 2, 2009, 15 pages.
Response to Office Action for U.S. Appl. No. 11/784,932, filed with U.S. Patent and Trademark Office on Jul. 2, 2009, 8 pages.
Advisory Action received for U.S. Appl. No. 11/508,782, mail date Aug. 31, 2009, 4 pages.
Response to Office Action for U.S. Appl. No. 11/508,782, filed with the U.S. Patent and Trademark Office on Nov. 13, 2009, 14 pages.
Office Action for U.S. Appl. No. 12/116,126, mail date Nov. 20, 2009, 7 pages.
Response to Office Action for U.S. Appl. No. 12/116,126, filed Feb. 22, 2010, 10 pages.
Office Action for U.S. Appl. No. 11/784,932, mail date Feb. 16, 2010, 11 pages.
Office Action for U.S. Appl. No. 11/508,782, mail date Feb. 24, 2010, 12 pages.
Response to Office Action for U.S. Appl. No. 11/959,225, filed Mar. 2, 2010, 9 pages.
Office Action for U.S. Appl. No. 12/116,126, mail date Apr. 22, 2010, 7 pages.

* cited by examiner

US 7,915,527 B1

HERMETIC SEAL AND HERMETIC CONNECTOR REINFORCEMENT AND REPAIR WITH LOW TEMPERATURE GLASS COATINGS

CROSS-REFERENCE TO RELATED APPLICATIONS

The present application is a continuation-in-part application and claims priority under 35 U.S.C. §120 to the U.S. patent application Ser. No. 11/508,782 entitled: Integrated Circuit Protection and Ruggedization Coatings and Methods filed Aug. 23, 2006, (pending) which is herein incorporated by reference in its entirety.

FIELD OF THE INVENTION

The present invention relates generally to electronic packaging and more particularly to hermetic module reinforcement and repair with low temperature glass coatings.

BACKGROUND OF THE INVENTION

A hermetic seal is an airtight seal which is impermeable to water in the liquid or vapor state. Hermetically sealed electronics modules are components that are designed and intended to secure and maintain the safety and quality of their contents. Hermetically sealed modules may be sealed utilizing a variety of processes including soldering, brazing or diffusion bonding such as with an indium-tin bond. Electrical interconnect to these sealed modules is provided with hermetic connectors that typically include glass frits that surround the electrical conductor and provide a seal between the hermetic module housing and the conductor.

Although diffusion bonded seals typically perform very well, they have been found to occasionally leak after rigorous mechanical shock and vibration testing. The cause of the leaks is due to failure at the metallic seal, which can be gold-tin, indium-tin, etc. depending on the sealing method used. This failure is often related to the formation of brittle intermetallics (alloys of two or more metals in a certain proportion, forming a new chemical compound) and corrosion. In addition, stresses induced by thermal expansion mismatch between the module housing and the glass frits in hermetic connectors can cause cracks in the glass which break the hermetic seal and can allow moisture penetration. Attempts have been made to utilize varnish to seal these cracks, but varnish is not hermetic. Opportunities to improve or repair hermetic seals and hermetic connectors are limited due to the requirement to maintain relatively low bonding temperatures to avoid damaging the electronic components within the sealed module.

Consequently, it would be desirable to provide a simple, low-cost, low-processing temperature method for hermetic seal and hermetic connector reinforcement, repair, and corrosion protection.

SUMMARY OF THE INVENTION

Accordingly, the present invention is directed to a low-cost, low-processing temperature, and simple additional hermetic seal reinforcement, repair, and corrosion protection for hermetically sealed modules.

A thin layer of glass is applied over the seal (such as a seal produced by a low-temperature indium-tin diffusion bonding process) or over the glass frit of the hermetic connector of a hermetically sealed module. The layer of glass comprises an alkali silicate glass. The layer of glass is produced from an alkali silicate material which is a low viscosity liquid at room temperature prior to curing (room temperature may typically comprise a range between about sixteen degrees Celsius and about twenty-seven degrees Celsius). The material is cured at low temperatures of typically no more than about 160 degrees Celsius to produce the layer of glass. Higher temperatures may be utilized to reduce cure time. Subsequent to curing, the layer of glass is intimately bonded (tightly adhering) to the seal, watertight, and is stable from about negative two-hundred forty-three degrees Celsius to at least about seven-hundred twenty-seven degrees Celsius.

The present invention provides a method for low-cost, low-processing temperature, and simple additional hermetic seal and hermetic connector reinforcement, repair, and corrosion protection for hermetically sealed modules. The glass layer provides corrosion protection, seals any existing leaks, and possesses the flexibility and adhesion necessary to survive the high mechanical stresses of shock and vibration testing. The resulting bond between the glass layer and the seal of the module is hermetic with good aqueous durability and is stable at a wide range of temperatures. The strength of the bond is similar to that of monolithic structures. Seals that can be repaired in this manner include both the interfaces between metallic module housings and the interfaces between hermetic connector glass frits and a module housing.

It is to be understood that both the foregoing general description and the following detailed description are exemplary and explanatory only and are not restrictive of the invention claimed. The accompanying drawings, which are incorporated in and constitute a part of the specification, illustrate an embodiment of the invention and together with the general description, serve to explain the principles of the invention.

BRIEF DESCRIPTION OF THE DRAWINGS

The numerous objects and advantages of the present invention may be better understood by those skilled in the art by reference to the accompanying figures in which.

DETAILED DESCRIPTION OF THE INVENTION

Reference will now be made in detail to exemplary embodiments of the invention, examples of which are illustrated in the accompanying drawings.

Figure 1:
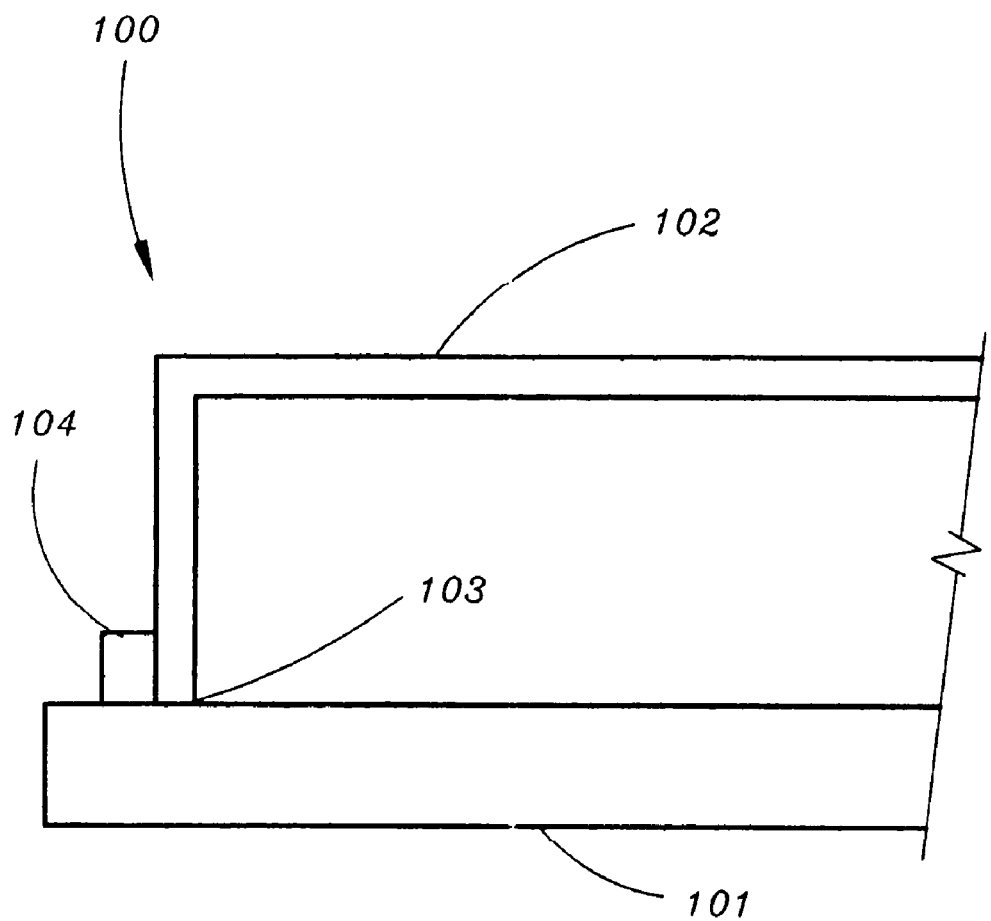
FIG. 1 is a block diagram illustrating a hermetically sealed module, in accordance with an exemplary embodiment of the present invention.

Referring generally to FIG. 1; a hermetically sealed module 100, in accordance with an exemplary embodiment of the present invention, is illustrated. The hermetically sealed module 100 includes a first housing portion 101 and a second housing portion 102. First housing portion 101 and second housing portion 102 are sealed together by seal 103. Seal 103 may be produced by a diffusion bonding process, such as a low-temperature indium-tin bonding process. Seal 103 may be a hermetic seal. Glass coating 104 coats seal 103.

Glass coating 104 may comprise a thin layer of alkali silicate glass as disclosed in co-pending and co-owned application "INTEGRATED CIRCUIT PROTECTION AND RUGGEDIZATION COATINGS AND METHODS" (application Ser. No. 11/508,782, filed Aug. 23, 2006). Glass coating 104 may have been applied to reinforce or repair the seal. The glass coating may be produced from material which is a low viscosity liquid at room temperature prior to curing (room temperature may comprise a range between about sixteen degrees Celsius and about twenty-seven degrees Celsius). The material may be an alkali silicate material. The material may be an alkali silicate material produced by fusing various proportions of sand ($SiO_2$) and alkali carbonate ($M_2CO_3$). The material may be an alkali silicate material with a $SiO_2/M_2O$ ratio of greater than or equal to about 2.5. The material may be an alkali silicate material with a $SiO_2/M_2O$ ratio of greater than or equal to about 4. The material may be an alkali silicate/water solution. The material may be an alkali silicate material with nanoparticle modifiers including, but not limited to, nano calcium carbonate, nano zinc oxide, and/or nano silicon dioxide. The material may be cured to produce the glass coating at low temperatures of typically no more than about 160 degrees Celsius. Subsequent to curing, the glass coating 104 is intimately bonded (tightly adhering) to seal 103, watertight, and may be stable from about negative two-hundred forty-three degrees Celsius to at least about seven-hundred twenty-seven degrees Celsius.

In alternative embodiments, the hermetically sealed module 100 may include less than two housing portions sealed by seat 103, which is coated with glass coating 104. In other alternative embodiments, the hermetically sealed module 100 may include more than two housing portions sealed by seal 103, which is coated with glass coating 104. In still further alternative embodiments, the hermetically sealed module may include any sort of housing sealed by seal 103, which is coated with glass coating 104, without departing from the scope of the present invention.

Figure 2:
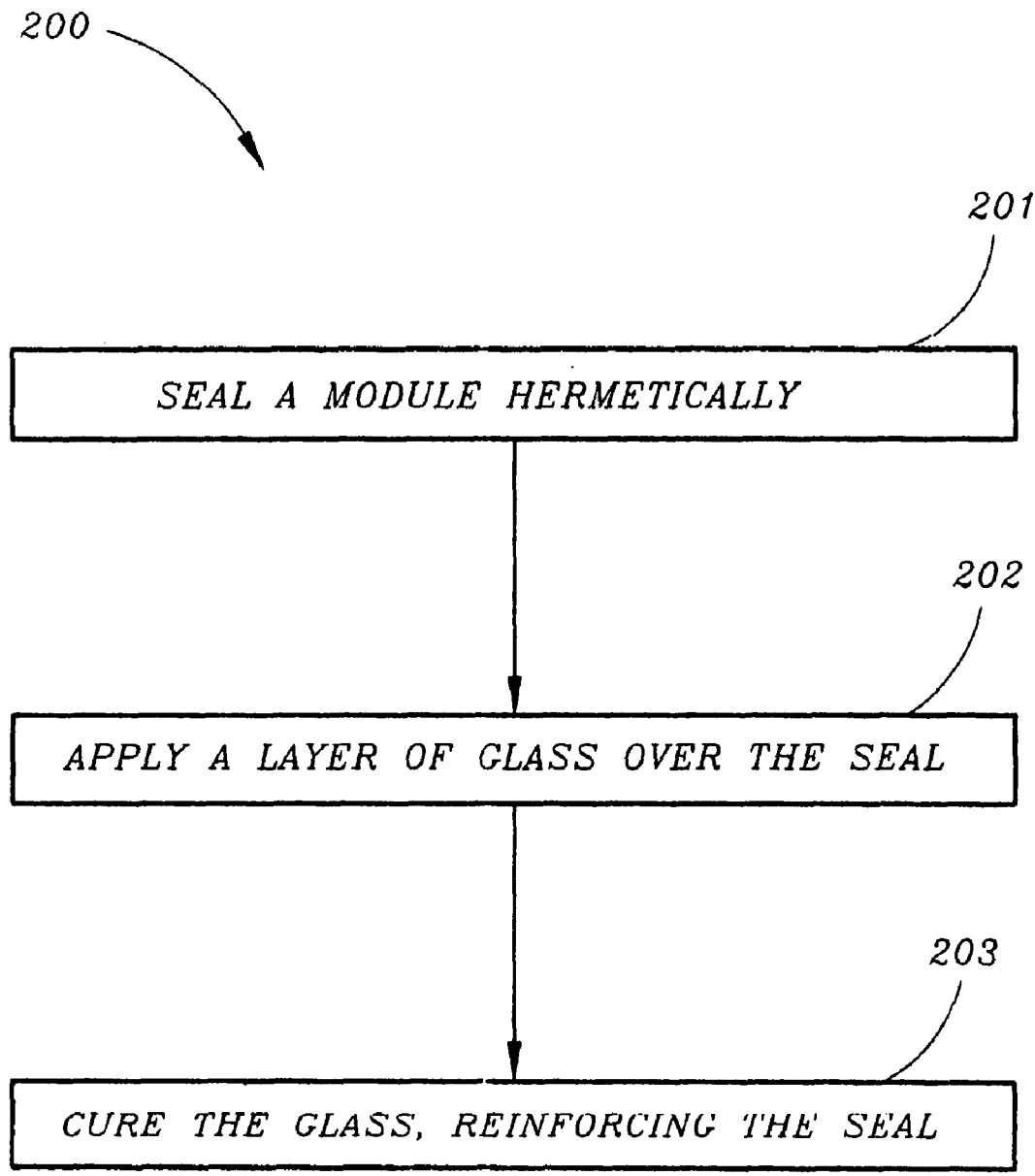
FIG. 2 is a flow chart illustrating a method of reinforcing and repairing a hermetic seal for a module, in accordance with an exemplary embodiment of the present invention.

Referring now to FIG. 2 a method 200 of reinforcing and repairing a hermetic seal for a module, in accordance with an exemplary embodiment of the present invention, is shown. In step 201, a module is sealed hermetically. In step 202, a layer of glass is applied over the seat. In step 203, the glass is cured, reinforcing and repairing the seal.

The seal may be produced by a metallurgic bonding process, such as a low-temperature indium-tin bonding process. Alternatively, the seal may be produced by a layer of glass. The layer of glass may comprise a thin layer of alkali silicate glass as disclosed in co-pending and co-owned application "INTEGRATED CIRCUIT PROTECTION AND RUGGEDIZATION COATINGS AND METHODS" (application Ser. No. 11/508,782, filed Aug. 23, 2006). The layer of glass may be produced from a material which is a low viscosity liquid at room temperature prior to curing (room temperature may comprise a range between about sixteen degrees Celsius and about twenty-seven degrees Celsius). The material may be an alkali silicate material. The material may be an alkali silicate material produced by fusing various proportions of sand ($SiO_2$) and alkali carbonate ($M_2CO_3$). The material may be an alkali silicate material with a $SiO_2/M_2O$ ratio of greater than or equal to about 2.5. The material may be an alkali silicate material with a $SiO_2/M_2O$ ratio of greater than or equal to about 4. The material may be an alkali silicate/water solution. The material may be an alkali silicate material with nanoparticle modifiers including, but not limited to, nano calcium carbonate, nano zinc oxide, and nano silicon dioxide. The material may be cured to produce the layer of glass at low temperatures of typically no more than about 160 degrees Celsius. Subsequent to curing, the layer of glass is intimately bonded (tightly adhering) to the seal, watertight, and may be stable from about negative two-hundred forty-three degrees Celsius to at least about seven-hundred twenty-seven degrees Celsius.

Figure 3:
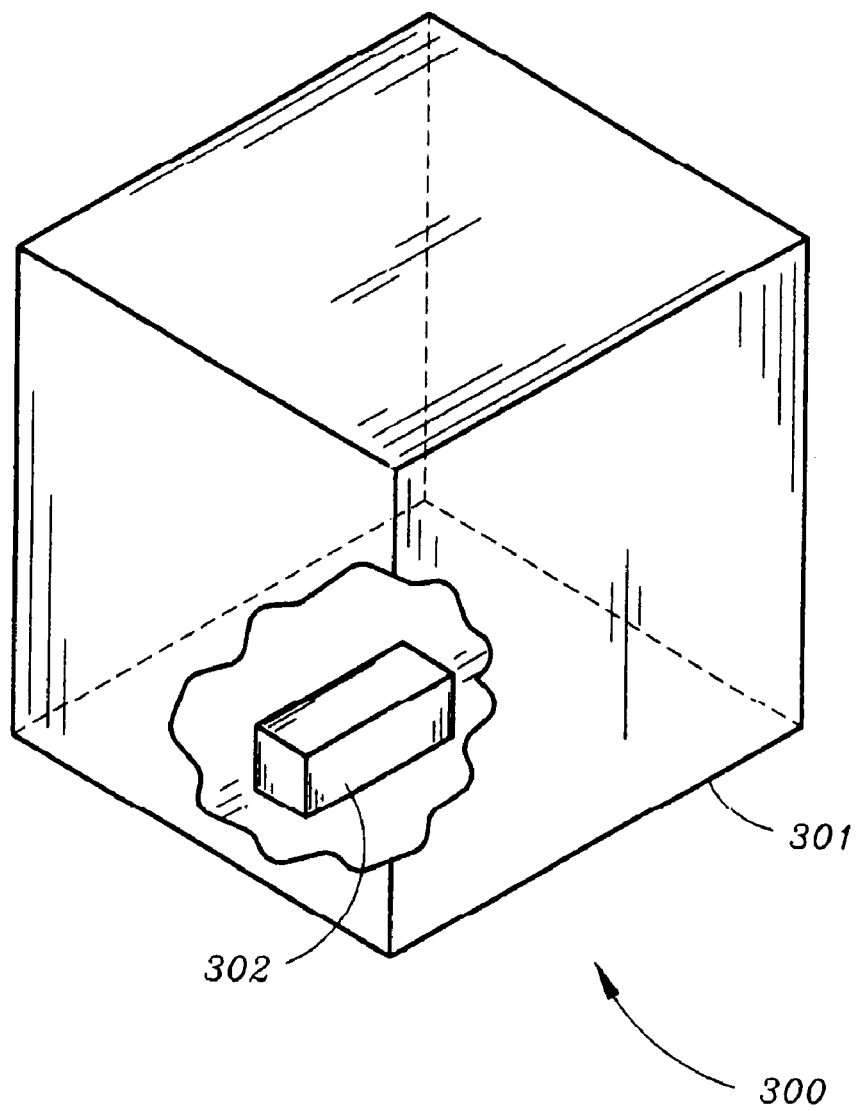
FIG. 3 is a block diagram illustrating an electronic device which includes a hermetically sealed module, in accordance with an alternative embodiment of the present invention.

Referring now to FIG. 3, an electronic device 300 including a hermetically sealed module 302, in accordance with an alternate embodiment of the present invention, is shown. Electronic device 300 includes a structure 301. The hermetically sealed module 302 is incorporated into the structure 302. Electronic device 300 may be any sort of electronic device which may include a hermetically sealed module, including but not limited to: a hermetic connector, an avionics system, a computing device, a rocket, a transportation device, a satellite, an optical device, a radio-frequency device, a data storage device, a component device, a data/signal processing device, a climate-control device, a transmitting/receiving device, and a communications device.

The hermetically sealed module 302 includes a seal which is coated with a glass coating. The seal may be produced by a diffusion bonding process, such as a low-temperature indium-tin bonding process. Alternatively, the seal may be produced by a layer of glass. The glass coating may have been applied to reinforce or repair the seal. The glass coating may comprise a thin layer of alkali silicate glass as disclosed in co-pending and co-owned application "INTEGRATED CIRCUIT PROTECTION AND RUGGEDIZATION COATINGS AND METHODS" (application Ser. No. 11/508,782, filed Aug. 23, 2006). The glass coating may be produced from a material which is a low viscosity liquid at room temperature prior to curing (room temperature may comprise a range between about sixteen degrees Celsius and about twenty-seven degrees Celsius). The material may be an alkali silicate material. The material may be an alkali silicate material produced by fusing various proportions of sand ($SiO_2$) and alkali carbonate ($M_2CO_3$). The material may be an alkali silicate material with a $SiO_2/M_2O$ ratio of greater than or equal to about 2.5. The material may be an alkali silicate material with a $SiO_2/M_2O$ ratio of greater than or equal to about 4. The material may be an alkali silicate/water solution. The material may be an alkali silicate material with nanoparticle modifiers including, but not limited to, nano calcium carbonate, nano zinc oxide, and nano silicon dioxide. The material may be cured to produce the glass coating at low temperatures of typically no more than about 160 degrees Celsius. Subsequent to curing, the glass coating is intimately bonded (tightly adhering) to the seal, watertight, and may be stable from about negative two-hundred forty-three degrees Celsius to at least about seven-hundred twenty-seven degrees Celsius.

Figure 5:
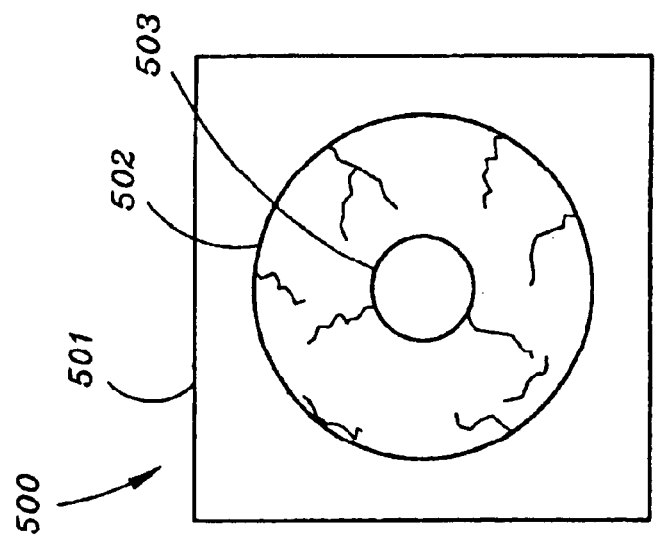
FIG. 5 is a front detail view block diagram illustrating a hermetic connector, as is known in the art.
Figure 4:
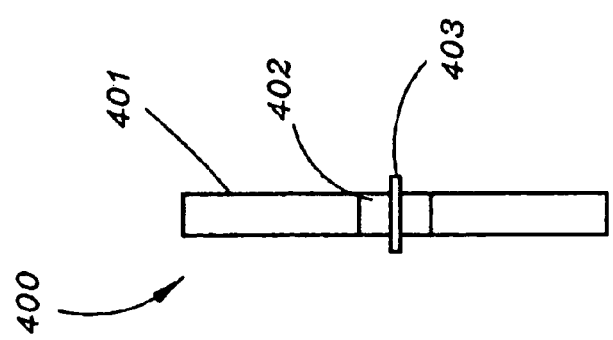
FIG. 4 is a side view block diagram illustrating a hermetic connector, as is known in the art.

Referring now to FIG. 4, a hermetic connector 400 (as is known in the art) including a housing 401, a glass frit 402, and an electrical passthrough 403, is shown. Referring now to FIG. 5, a hermetic connector 500 (as is known in the art) including a housing 501, a glass frit 502, and an electrical passthrough 503, is shown. Glass frit 502 includes cohesive cracks (within glass frit 502) and adhesive cracks (between housing 501 and glass frit 502) formed due to thermal and dynamic stresses. Cohesive fractures (cracks) are failures characterized by the body of a sealant or adhesive pulling apart. Adhesive fractures are failures characterized by the adhesive or sealant pulling loose from the adherend.

Figure 6:
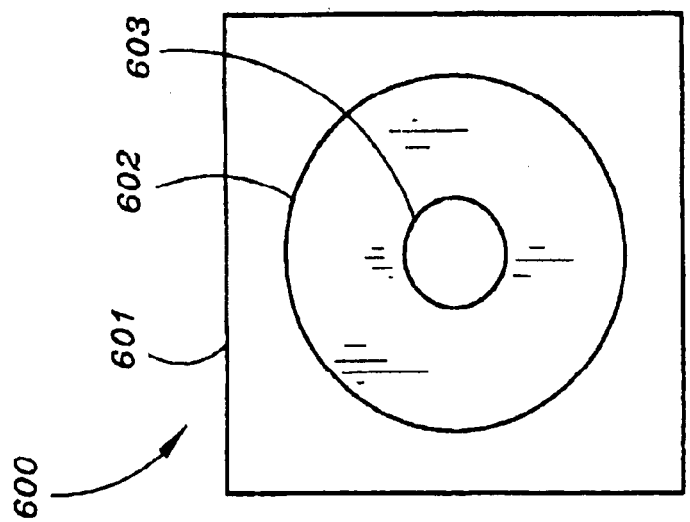
FIG. 6 is front detail view block diagram illustrating a hermetic connector, in accordance with an alternative embodiment of the present invention.

Referring now to FIG. 6, a hermetic connector 600 including a housing 601, a glass frit 602, and an electrical passthrough 603, in accordance with an alternative embodiment of the present invention, is shown. A layer of glass has been applied to the surface of glass frit 602, repairing cracks present in glass frit 602. As illustrated, the layer of glass has been applied over the entire surface of glass frit 602. However, the layer of glass may be applied over only a portion of the surface of glass frit 602 without departing from the scope of the present invention. The layer of glass may be applied to individual cracks in glass frit 602 or even portions of individual cracks of glass frit 602.

The layer of glass may comprise a thin layer of alkali silicate glass as disclosed in co-pending and co-owned application "INTEGRATED CIRCUIT PROTECTION AND RUGGEDIZATION COATINGS AND METHODS" (application Ser. No. 11/508,782, filed Aug. 23, 2006). The layer of glass may be produced from a material which is a low viscosity liquid at room temperature prior to curing (room temperature may comprise a range between about sixteen degrees Celsius and about twenty-seven degrees Celsius). The material may be an alkali silicate material. The material may be an alkali silicate material produced by fusing various proportions of sand ($SiO_2$) and alkali carbonate ($M_2CO_3$). The material may be an alkali silicate material with a $SiO_2/M_2O$ ratio of greater than or equal to about 2.5. The material may be an alkali silicate material with a $SiO_2/M_2O$ ratio of greater than or equal to about 4. The material may be an alkali silicate/water solution. The material may be an alkali silicate material with nanoparticle modifiers including, but not limited to, nano calcium carbonate, nano zinc oxide, and nano silicon dioxide. The material may be cured to produce the layer of glass at low temperatures of typically no more than about 160 degrees Celsius. Subsequent to curing, the layer of glass is intimately bonded (tightly adhering) to the seal, watertight, and may be stable from about negative two-hundred forty-three degrees Celsius to at least about seven-hundred twenty-seven degrees Celsius.

Figure 7:
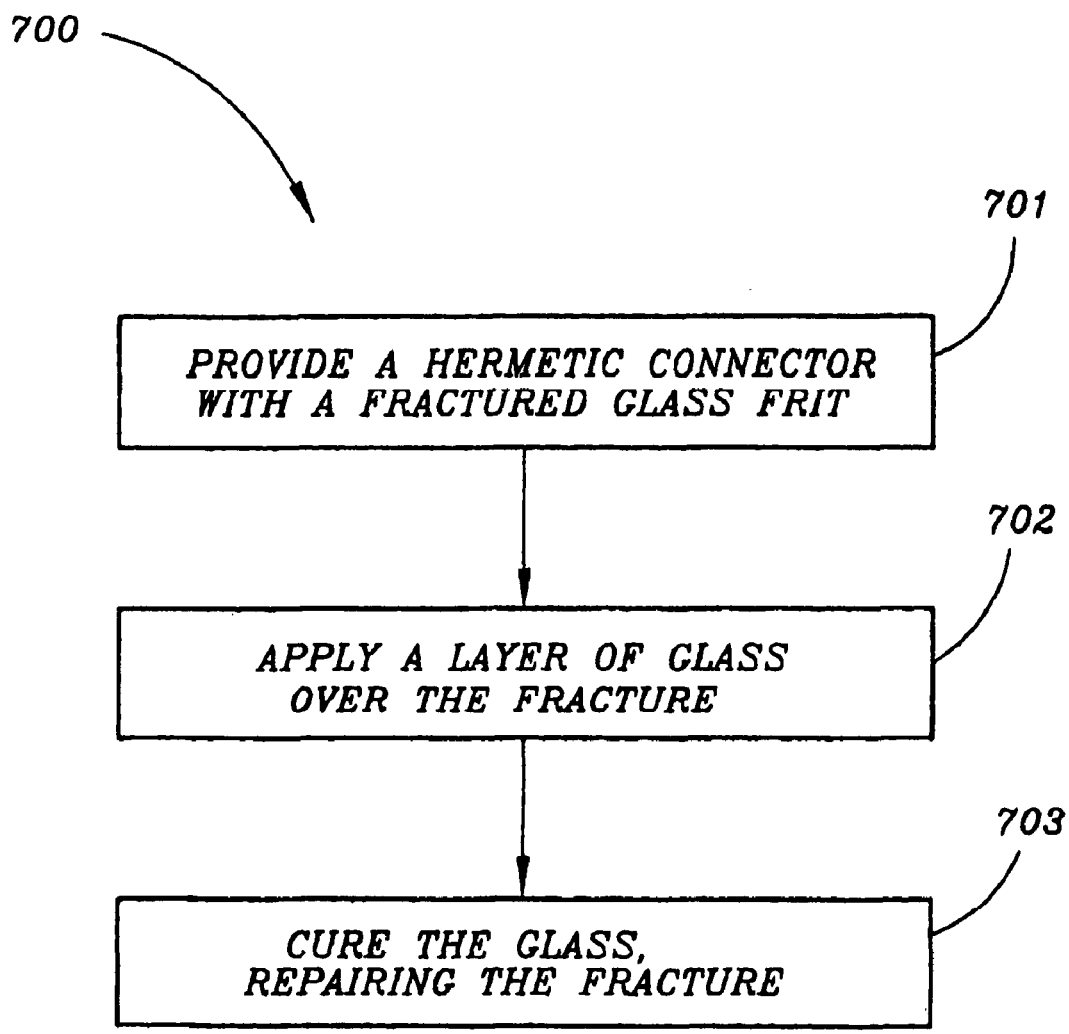
FIG. 7 is a flow chart illustrating a method of repairing a hermetic connector, in accordance with an exemplary embodiment of the present invention.

Referring now to FIG. 7, a method 700 of repairing a hermetic connector, in accordance with an exemplary embodiment of the present invention, is shown. In step 701, a hermetic connector, which includes a fractured glass frit, is provided. In step 702, a layer of glass is applied over the fracture. In step 703, the layer of glass is cured, repairing the fracture.

The layer of glass may comprise a thin layer of alkali silicate glass as disclosed in co-pending and co-owned application "INTEGRATED CIRCUIT PROTECTION AND RUGGEDIZATION COATINGS AND METHODS" (application Ser. No. 11/508,782, filed Aug. 23, 2006). The layer of glass may be produced from a material which is a low viscosity liquid at room temperature prior to curing (room temperature may comprise a range between about sixteen degrees Celsius and about twenty-seven degrees Celsius). The material may be an alkali silicate material. The material may be an alkali silicate material produced by fusing various proportions of sand ($SiO_2$) and alkali carbonate ($M_2CO_3$). The material may be an alkali silicate material with a $SiO_2/M_2O$ ratio of greater than or equal to about 2.5. The material may be an alkali silicate material with a $SiO_2/M_2O$ ratio of greater than or equal to about 4. The material may be an alkali silicate/water solution. The material may be an alkali silicate material with nanoparticle modifiers including, but not limited to, nano calcium carbonate, nano zinc oxide, and nano silicon dioxide. The material may be cured to produce the layer of glass at low temperatures of typically no more than about 160 degrees Celsius. Subsequent to curing, the layer of glass is intimately bonded (tightly adhering) to the seal, watertight, and may be stable from about negative two-hundred forty-three degrees Celsius to at least about seven-hundred twenty-seven degrees Celsius.

The present invention provides low-cost, low-processing temperature, and simple additional hermetic seal and hermetic connector reinforcement, repair, and corrosion protection for hermetically sealed modules. The glass coating or layer provides corrosion protection, seals any existing leaks, and possesses the good flexibility and adhesion necessary to survive the high mechanical stresses of shock and vibration testing. The resulting bond between the glass coating or layer and the seal of the module is hermetic with good aqueous durability and is stable at a wide range of temperatures. The strength of the bond is similar to that of monolithic structures.

It is understood that the specific order or hierarchy of steps in the processes disclosed is an example of exemplary approaches. Based upon design preferences, it is understood that the specific order or hierarchy of steps in the processes may be rearranged while remaining within the scope of the present invention. The accompanying method claims present elements of the various steps in a sample order, and are not meant to be limited to the specific order or hierarchy presented.

It is believed that the present invention and many of its attendant advantages will be understood by the foregoing description, and it will be apparent that various changes may be made in the form, construction, and arrangement of the components thereof without departing from the scope and spirit of the invention or without sacrificing all of its material advantages. The form herein before described being merely an explanatory embodiment thereof, it is the intention of the following claims to encompass and include such changes.

What is claimed is:

1. An electronic device, comprising:
  a hermetically sealed module, comprising:
    a module comprising a housing portion;
    a metallurgical seal in contact with the housing portion; and
    a glass coating produced from an alkali silicate material comprising $SiO_2$ and $M_2O$, wherein $M_2O$ is an alkali oxide;
  wherein the seal hermetically seals the module and the glass coating coats the seal and is of a composition to seal any existing leaks which might include at least one of a cohesive fracture and an adhesive fracture.

2. The electronic device as claimed in claim 1, wherein the glass coating is produced from said alkali silicate material which is a low viscosity liquid at between about sixteen degrees Celsius and about twenty-seven degrees Celsius prior to curing.

3. The electronic device as claimed in claim 1, wherein the glass coating cures at temperatures of no more than about one-hundred sixty degrees Celsius.

4. The electronic device as claimed in claim 1, wherein the glass coating is stable from about negative two-hundred forty-three degrees Celsius to at least about seven-hundred twenty-seven degrees Celsius.

5. An electronic device, comprising:
  a hermetic connector, comprising:
    an electrical feedthrough;
    a glass frit which is connected to the electrical feedthrough and has at least one fracture caused by one selected from a cohesive failure and an adhesive failure; and
    a housing which is connected to the glass frit;

wherein the at least one fracture within the glass frit is sealed with a glass coating produced from an alkali silicate material comprising $SiO_2$ and $M_7O$, wherein $M_7O$ is an alkali oxide, wherein the glass coating is applied over an entire surface of the glass frit.

6. The electronic device as claimed in claim 5, wherein the glass coating is produced from said alkali silicate material which is a low viscosity liquid at between about sixteen degrees Celsius and about twenty-seven degrees Celsius prior to curing.

7. The electronic device as claimed in claim 5, wherein the glass coating cures at temperatures of no more than about one-hundred sixty degrees Celsius.

8. The electronic device as claimed in claim 5, wherein the glass coating forms a bond which is stable from about negative two-hundred forty-three degrees Celsius to at least about seven-hundred twenty-seven degrees Celsius.

9. An electronic device, comprising:
a hermetically sealed module, comprising:
  a housing portion;
  a seal in contact with the housing portion; and
  a glass coating produced from an alkali silicate material comprising $SiO_2$ and $M_2O$, wherein $M_2O$ is an alkali oxide;
wherein the seal hermetically seals the housing portion and the glass coating coats the seal, wherein the glass coating coats the seal which might include fractures caused by a cohesive fracture or an adhesive fracture.

10. The electronic device as claimed in claim 9, wherein the glass coating is produced from an alkali silicate material which is a low viscosity liquid at between about sixteen degrees Celsius and about twenty-seven degrees Celsius prior to curing.

* * * * *

UNITED STATES PATENT AND TRADEMARK OFFICE
CERTIFICATE OF CORRECTION

| | | |
|---|---|---|
| PATENT NO. | : 7,915,527 B1 | Page 1 of 1 |
| APPLICATION NO. | : 11/784158 | |
| DATED | : March 29, 2011 | |
| INVENTOR(S) | : Nathan P. Lower, David M. Brower and Ross K. Wilcoxon | |

It is certified that error appears in the above-identified patent and that said Letters Patent is hereby corrected as shown below:

In the Claims:
Column 7, Claim 5,
line 3, replace "$M_7O$" with --$M_2O$--.
line 4, replace "$M_7O$" with --$M_2O$--.

Signed and Sealed this
Twenty-eighth Day of June, 2011

David J. Kappos
*Director of the United States Patent and Trademark Office*